United States Patent [19]

Chiang et al.

[11] Patent Number: 5,262,500
[45] Date of Patent: Nov. 16, 1993

[54] PREPARATION OF NOVEL SILICON-CONTAINING PHOTORESISTS FOR USE IN IC MICROLITHOGRAPHY

[75] Inventors: Wen-Yen Chiang; Jin-Yuh Lu, both of Taipei, Taiwan

[73] Assignee: Tatung Co., Taipei, Taiwan

[21] Appl. No.: 781,616

[22] Filed: Oct. 23, 1991

[51] Int. Cl.$^5$ .................... C08F 222/40; C08F 230/08
[52] U.S. Cl. .................... 526/262; 526/279; 430/331
[58] Field of Search .......................... 526/262

[56] References Cited

U.S. PATENT DOCUMENTS 3,265,708  8/1966  Stiteler ........................ 548/549
4,624,909 11/1986  Saotome et al. ............... 430/192
4,740,561  4/1988  Tsujimoto et al. ............. 525/327.6

OTHER PUBLICATIONS

Turner et al, "High-T Base-Soluble Copolymers as Novolac Replacements for Positive Photoresists", *Polymer Engineering and Science*, vol. 26, No. 16 (Mid-Sep., 1986), pp. 1096–1100.

Wilkins et al, "An Organosilicon Novalac Resin for Multilevel Resist Applications", *J. Vac. Sci. Technol.*, B3(1) (Jan.Feb. 1985), pp. 306–309.

Saotome et al, "A Silicon Containing Positive Photoresist (SIPR) for a Bilayer Resist System", *J. Electrochem. Soc.: Solid-State Science and Technology*, vol. 132, No. 4 (Apr. 1985), pp. 909–913.

Tarascon et al, "The Synthesis and Lithographic Evaluation of a New Organosilicon Novolac-Based Resist", *Journal of Polymer Science: Part A: Polymer Chemistry*, vol. 26 (1988), pp. 3173–3187.

*Primary Examiner*—Joseph L. Schofer
*Assistant Examiner*—Wu C. Cheng
*Attorney, Agent, or Firm*—Lowe, Price, LeBlanc & Becker

[57] ABSTRACT

Silicon containing copolymers are mixed with diazonaphthoquinone esters to give UV photoresists for use in microlithography on integrated circuits (IC). The copolymer structure has a thermally resistant group, N-(4-hydroxyphenyl)maleimide, and an oxygen plasma resistant group, para-trialkylsilylstyrene.

4 Claims, 2 Drawing Sheets (IIa)

(IIb)

(IIc)

R =

PREPARATION OF NOVEL SILICON-CONTAINING PHOTORESISTS FOR USE IN IC MICROLITHOGRAPHY

FIELD OF THE INVENTION

The present invention relates to several new silicon-containing copolymers mixed with diazonaphthoquinone esters to give UV photoresists for use in the microlithography on integrated circuits (IC). The copolymer structure has a thermally resistant group, N-(4-hydroxyphenyl)maleimide, and an oxygen plasma resistant group, para-trialkylsilylstyrene.

N-(4-acetoxyphenyl)maleimide (APMI) is a light yellow needle crystal produced by reacting maleamic acid, sodium acetate and acetic anhydride at a temperature of 70° C. for a period of 2 hours and followed by recrystallization from ethanol for three times.

Para-trialkylsilystyrene (TASS) is a colorless liquid prepared by first combining para-chlorostyrene with magnesium to form a Grignard reagent, then slowly adding the reagent dropwise into chlorotrialkysilane, for example chlorotrimethylsilane, and after reacting for 24 hours, extracting the product with ether and distilling the same under reduced pressure.

SUMMARY OF THE INVENTION

Above mentioned Si-containing copolymer is prepared by dissolving an equal molar ratio of the above synthesized monomers APMI and TASS in 1,4-dioxane; using azobisisobutyronitrile as initiator to perform copolymerization and provide a copolymer of white and/or light yellowish product (Ia) having a weight average molecular weight (Mw) of 50,000-120,000; then by ester exchange the acetoxy group on the benzene ring is converted into a hydroxy to obtain a novel copolymer (Ib). Copolymer (Ib) is confirmed to be an alternative copolymer with a structure of 1:1 by elemental analysis and the reaction scheme is shown in FIG. 1.

It is another object of the invention to formulate a photoresist material. A photoresist is formulated by mixing Ib with photosensitive azo compound (one of IIa–IIc) in a solvent wherein, the photosensitive azo compound is diazonaphthoquinone esters having a structural formula shown in FIG. 2. The photoresist is spin-coated onto a silicon wafer and solvents used are xylene, isoamyl, methyl cellosolve acetate, ethyl cellosolve acetate or cellosolve acetate or mixtures of two or three of the above-mentioned solvents. Following spin-coating onto the silicon wafer, by adequate baking a coated photoresist film is given as required. This photoresist material is sensitive to electron beam, X-ray, near UV, deep UV or visible light. After exposure, the photoresist is submerged in an aqueous alkaline solution and then dissociated with acetone, tetrahydrofuran, 1,4-dioxane or isopropanol to get a negative image. It is noteworthy that according to the photo-chemical reaction mechanism of diazonaphthoquinone compounds suggested in SUS reaction, diazonaphthoquinone compound is irradiated and hydrolyzed from an alkaline unsoluble condition and convert to an alkaline soluble condition. Additionally, the polymer is also soluble in alkaline aqueous solution. It is this solubility difference which makes the irradiated area dissolve quickly and developing to give a positive image. The invention also effects the exposure and development based on this theory but has an important discovery that in the image obtained is negative. The reason is presumed to be that in the part of paratrialkylsilylstyrene, alpha-carbon produces free radicals and crosslinks resulting in an unsoluble irradiation area such that a negative image is obtained. The resolution of the pattern formed is as small as 1.1 micrometer. With respect to the thermal resistance, lines of the pattern will not bend or deform after baking at 330° C. for 30 minutes. Because there is silyl group existing on the benzene ring in the structure of the copolymer, the photoresist has a stronger hydrophobic activity and has a better adhesion to the silicon wafer. Therefore, no torsion occurres after spin development. Because of the above described reasons, the photoresist of the present invention is simplified by omitting the step of coating an adhesion promoter, such as, e.g. hexamethylenedisilane (HMDS) onto the silicon wafer before coating the photoresist to increase the affinity between the photoresist film and the silicon wafer. The above discussion relates to application of photoresist in a monolayer photoresist system, i.e. a photoresist is directly applied onto a silicon wafer and then a microlithography procedure is used to give a pattern. Two-layer photoresist system is employed in the process of the invention, that is coating a thicker layer of non-photosensitive polymer, such as, novolac or polyimide as the under layer to flatten the wafer and then, coating a layer of photoresist on the top of the non-photosensitive polymer layer, after exposure and development, the upper patterned layer acting as a mask for the lower layer and the pattern being transferred to the underlayer by means of oxygen plasma etching. Of course, the premise is that the photoresist membrane must be oxygen plasma etching-resistant and Si-containing polymer is confirmed to own this ability. The photoresist according to the invention possesses said function, for example, for the purpose of etching the underlayer of HPR-204 (Hunt Inc., U.S.A.) of about 15,000 Å, an upper layer of invented photoresist in about 2,000 Å is sufficient to mask the site not to be etched.

DETAILED DESCRIPTION OF PREFERRED EMBODIMENT

Figure 1:
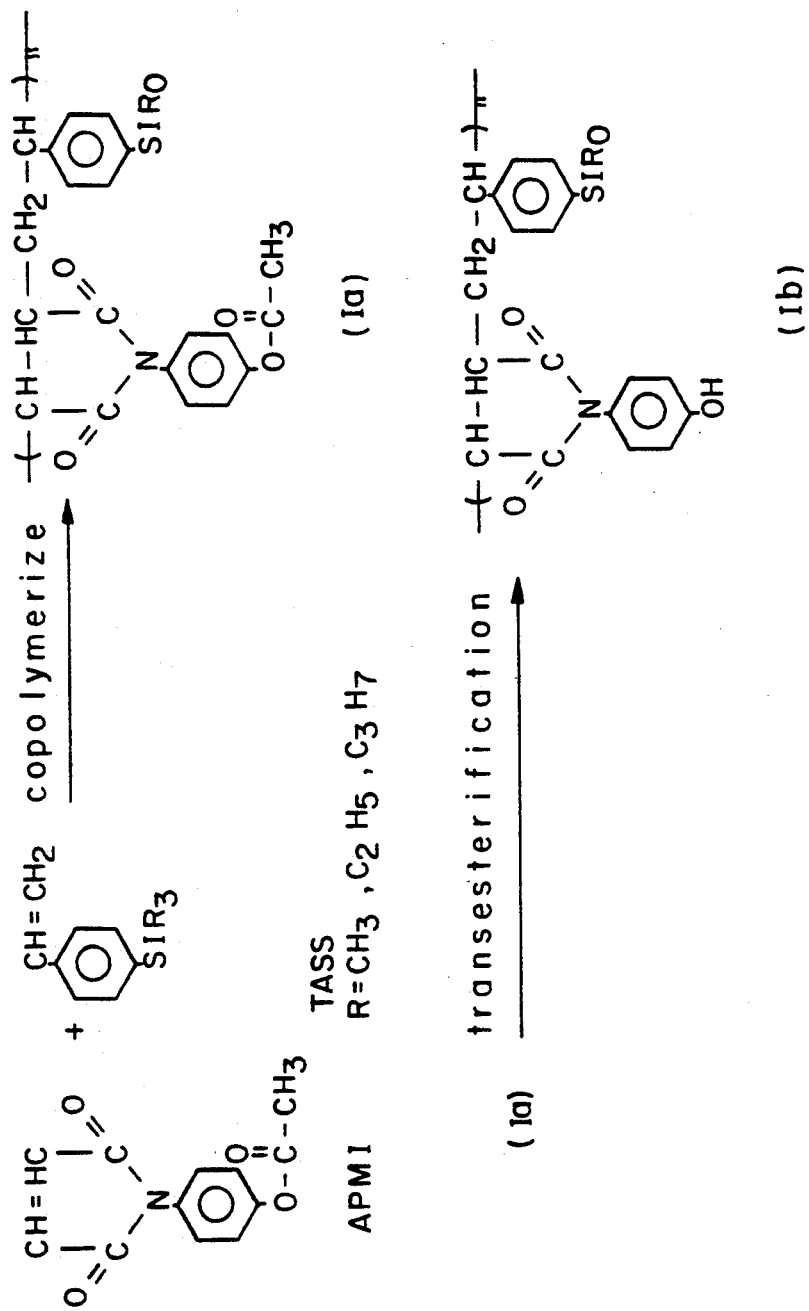
Figure 2:
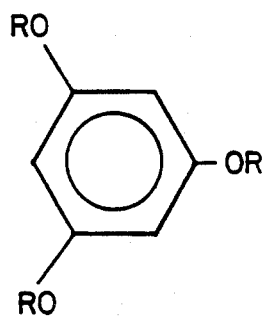
Figure 2:
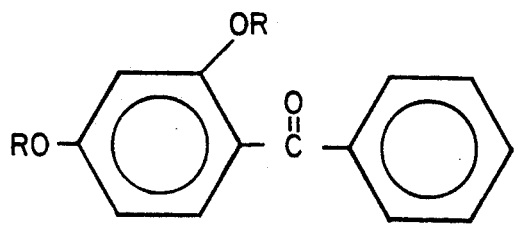
Figure 2:
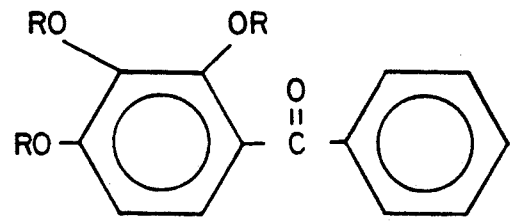
Figure 2:
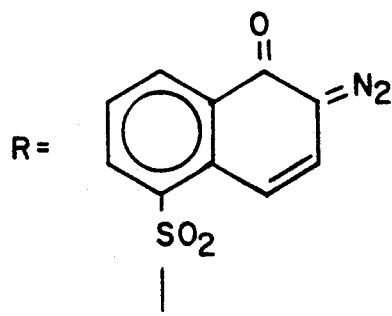

The following examples are given to further illustrate the invention.

1) Synthesis of a monomer

1. Preparation of N-(4-acetoxyphenyl)maleimide (APMI)

To a three-neck 1 liter reaction vessel equipped with a condenser, a teflon stirring rod and a thermometer, 97 g (0.49 moles) of N-(4-hydroxyphenyl)maleamic acid, 27.7 g (0.38 moles) of sodium acetate and 400 g of acetic anhydride are added and then heated by using silicone oil. When the reaction solution reaches 70° C. for 2 hours with stirring, the solution is poured into a large amount of distilled water and a great amount of precipitates are formed. The precipitate is taken by filtration and washed several times with distilled water to remove acetic acid, followed by recrystallization from ethanol to give the titled compound. Yield 53%. B.P. 155°–158° C.

Elemental analysis, Calcd. C:62.33%, H:3.89%, N:6.06%; Measd. C:62.29%, H:3.85%, N:5.94%.

2. Preparation of para-trimethylsilylstyrene (R=CH$_3$, TMSS)

Placing 2 g (83 mmole) of magnesium into a three-neck reaction vessel provided with a condenser and an equal pressure seperation funnel, the reaction is carried out under a nitrogen blanket. The reaction is initiated by adding a little amount of THF and then adding tracing amount of p-chlorostyrene and iodine and again, a large quantity of THF is added. From an equipressure separation funnel containing 10 g of p-chlorostyrene and 20 ml of THF, the content is added dropwise into the reaction solution and refluxed for 2 hours.

The reaction solution is cooled to 40° C., 7.8 g (72 mmole) of chlorotrimethylsilane is added therein dropwise slowly and then reacted for 24 hours. A large amount of water is added and by extracting with ether, the organic layer is pooled and dried over magnesium sulfate. The residue is distilled under vacuum of 4.2 mmHg/84° C. to have a yield of 38%. The product is separated and purified by column chromatography (use silica gel as packing material and n-hexane as eluent).

2) Synthesis of a copolymer

1. Preparation of poly(APMI-alt-AMSS)

2.32 g (0.01 mole) of APMI is placed in a 50 ml ampoule, and a solution of 1.76 g (0.01 mole) of TMSS and 0.08 g of AIBN in 25 ml of 1,4-dioxane is poured into the ampoule. The whole reactant mixture is condensed in a dry ice-acetone bath. After purging with nitrogen for 30 to 45 minutes, the ampoule is sintered with mixed oxygen-gas and left in a constant temperature tank of 60° C. for 24 hours. The ampoule is sawed open, the viscous liquid content is poured in to methanol, purified with ether and dried in a vacuum oven for 24 hours, Yield 86%. Limiting viscosity: 0.66; weight average molecular weight: 89,309.

Elemental Analysis (calculated in 1:1 structure): Calcd. C:67.81%, H: 6.145%, N:3.43%; Measd. C:67.61%, H:6.135%, N:3.43%.

The effect of the initiator (azobisisobutyronitrile) and the solvent (1,4-dioxane) to the molecular weight of the copolymer is summarized in Table 1.

2. Preparation of poly[N-(4-hydroxyphenyl)maleimide-alt-TMSS]

2.5 g of poly(APMI-alt-TMSS) is dissolved in 120 ml of acetone and therein is added 15 ml of methanol, 20 ml of acetone and 1.2 g of p-toluenesulfonic acid. Then, methanol and methyl acetate are slowly evaporated until about 30 ml of viscous liquid is left, and then poured into methanol to give 2.17 g (yield 97%) of the product.

Elemental Analysis: Calcd. C:69.04%, H:6.30%, N:3.83%; Measd. C:68.96%, H:6.28%, N:3.82%.

Fundamental properties of the copolymer are set out in Table 2.

3) Microlithographic procedure

The photoresist consists of 5 wt % of silicon-containing copolymer Ib (Mw ca. 90,000) and 3 wt % of photosensitive compound IIc dissolved in 92 wt % of cellosolve acetate and is referred to as ph-1. It is formulated by filtering through a Millipore filter of a pore size of 0.5 micrometer.

On a silicon wafer of 4 inches is spin coated (4000 rpm) ph-1. The coated wafer is baked in an oven of a temperature of 120° C. for 30 minutes to give a thin film of 0.25 micrometer thickness. The film is subjected to near UV irradiation by a contact exposure machine, Canon PLA-501F with exposure dose of 40.25 mj/cm$^2$. Thereafter, the silicon wafer is dipped in a 5% aqueous alkaline solution of tetramethylammonium hydroxide for 12 seconds. The wafer is then dissociated and developed with isopropanol. A pattern having a resolution of 1.1 micrometer is obtained. This pattern is baked in an oven for 30 minutes at a temperature of 200°, 250°, 300° and 330° C., respectively and no bending or deformation is observed.

Ph-1 is exposed under the same conditions as above except without dipping in alkaline aqueous solution and is instead developed directly with isopropanol. It is found that provided a complete development be required the exposure dose will be extremely large. If compared by the interface gel dose ($D_g^i$), a big difference exists, with aqueous alkaline solution, 14 mj/cm$^2$; and without aqueous alkaline solution, 120 mj/cm$^2$. Therefore, in the process of the invention, the development should include said two steps for the sake of energy saving.

4) Oxygen plasma etch

In the system of a double-layer photoresist, HPR-204 is first coated onto a silicon wafer and after baking a thick membrane of 15,000 Å is given. Then, coating ph-1 over HPR-204, following exposure as described in section (3) and development, oxygen plasma etching (operation status: Rf power 1300 W, chamber pressure 0.4 torr) is carried out. While etching an underlayer of about 15,000 Å of film thickness, an upper layer of photoresist thin film in about 2,000 Å is sufficient to resist the oxygen plasma etching and the pattern transferring to the underlayer is completed.

TABLE 1

| polymer No. | Rx. time (hr.) | Azobisisobutyronitrile (g.) | 1,4-dioxane (ml.) | Yield (%) | infrinsic viscosity (n) | wt average | no. average M.W. |
|---|---|---|---|---|---|---|---|
| CP-1a | 24 | 0.08 | 25 | 86 | 0.55 | 50,000 | 20,000 |
| CP-2a | 24 | 0.06 | 25 | 84 | 0.66 | 90,000 | 32,000 |
| CP-3a | 36 | 0.05 | 17 | 96 | 0.95 | 98,000 | 35,000 |
| CP-4a | 20 | 0.04 | 17 | 81 | 1.01 | 100,000 | 30,000 |
| CP-5a | 22 | 0.035 | 25 | 82 | 1.18 | 120,000 | 85,000 |

TABLE 2

| Basic properties of Si-containing copolymer (Ib) | |
|---|---|
| Color | White and/or light yellowish |
| Crystallinity | Amorphous |
| Solubility | Soluble in acetone, tetrahydrofuran, xylene, pyridine TMAH (5%), IPA |
| weight average molecular weight | 50,000–120,000 |
| number average molecular weight | 20,000–85,000 |
| m.p. | 260–310° C. |
| Decomposition temperature | 420–480° C. |
| Oxygen plasma etching ratio to HPR-204 | 1:5–1:7.5 |

We claim:

1. A silicon containing alternative copolymer having repeating units of the formula:

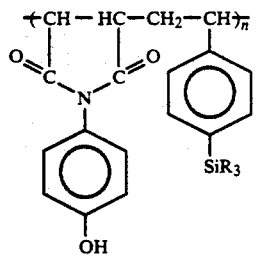

wherein R is $CH_3$, $C_2H_5$ or $C_3H_7$.

2. A copolymer as defined by claim 1, having a weight average molecular weight of 50,000–120,000.

3. A copolymer as defined by claim 1, prepared by mixing N-(4-acetoxyphenyl)maleimide and para-trialkylsilylstyrene in a molar ratio of 1:1; adding 0.2–0.5 weight percent of azobisisobutyronitrile as an initiator; dissolving the mixture in a solvent and copolymerizing the reactants for 20–36 hours at a reaction temperature of 60°–100° C.; precipitating the product using methanol as a precipitating agent to obtain a purified polymer; and transesterifying the purified polymer to produce N-(4-hydroxyphenyl)maleimide/para-trialkylsilylstyrene copolymer.

4. A copolymer as defined in claim 3, wherein, the solvent is acetone, tetrahydrofuran or 1,4-dioxane, and the quantity added is 70–85 wt %.